(12) United States Patent
Pierrat (10) Patent No.: US 8,423,925 B1
(45) Date of Patent: *Apr. 16, 2013

(54) SYSTEM AND METHOD FOR COMPRESSED POST-OPC DATA

(75) Inventor: Christophe Pierrat, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/330,580

(22) Filed: Dec. 19, 2011

Related U.S. Application Data (62) Division of application No. 12/391,185, filed on Feb. 23, 2009, now Pat. No. 8,191,016.

(51) Int. Cl.
*G06F 17/50* (2006.01)
*G03F 1/00* (2012.01)

(52) U.S. Cl.
USPC ............. 716/53; 716/50; 716/51; 716/52; 716/54; 716/55; 430/4; 430/5

(58) Field of Classification Search ............. 716/50–55; 430/4, 5
See application file for complete search history.

(56) References Cited

U.S. PATENT DOCUMENTS

| | | | |
|---|---|---|---|
| 7,131,100 B2 * | 10/2006 | Lin et al. .................. 716/52 |
| 7,275,227 B1 | 9/2007 | Ying | |
| 7,337,421 B2 | 2/2008 | Kamat | |
| 7,367,009 B2 | 4/2008 | Cobb et al. | |
| 7,480,890 B2 | 1/2009 | Hsiao | |
| 7,530,049 B2 | 5/2009 | Kobayashi et al. | |
| 7,617,477 B2 | 11/2009 | Ye et al. | |
| 7,617,478 B2 | 11/2009 | Rieger et al. | |
| 7,685,558 B2 | 3/2010 | Lai et al. | |
| 7,694,267 B1 | 4/2010 | Ye et al. | |
| 7,711,504 B2 | 5/2010 | Pan et al. | |
| 7,712,068 B2 | 5/2010 | Ren et al. | |
| 7,882,480 B2 | 2/2011 | Ye et al. | |
| 8,102,408 B2 * | 1/2012 | Verma et al. ............... 346/87 |
| 8,103,984 B1 * | 1/2012 | Pierrat ....................... 716/53 |
| 2008/0072207 A1 | 3/2008 | Verma et al. | |
| 2009/0241087 A1 | 9/2009 | Zhang et al. | |
| 2009/0307649 A1 | 12/2009 | Pramanik et al. | |
| 2010/0175042 A1 | 7/2010 | Tirapu Azpiroz et al. | |
| 2010/0253381 A1 | 10/2010 | Hapke et al. | |
| 2011/0016438 A1 | 1/2011 | Rieger et al. | |
| 2011/0139027 A1 | 6/2011 | Hansen | |
| 2012/0127442 A1 * | 5/2012 | Bruce et al. ................ 355/53 |

* cited by examiner

*Primary Examiner* — Helen Rossoshek
(74) *Attorney, Agent, or Firm* — Kenyon & Kenyon LLP (57) ABSTRACT

According to various embodiments of the invention, systems and methods for system and methods for compressed post-OPC data created during the design and manufacturing of integrated circuits. In one embodiment of the invention, the method begins by generating a post-OPC layout from a circuit layout during the design phase of a circuit. This post-OPC layout is generated by way of an OPC process. Next, a set of differences between the post-OPC layout and the circuit layout are calculated and a dataset containing these differences are generated In some embodiments the dataset is generated during the OPC process.

9 Claims, 9 Drawing Sheets

SYSTEM AND METHOD FOR COMPRESSED POST-OPC DATA

CROSS-REFERENCE TO RELATED APPLICATIONS

The present application is a divisional of and claims the benefit of U.S. Non-Provisional Application Ser. No. 12/391,185, filed Feb. 23, 2009, entitled, "SYSTEM AND METHOD FOR COMPRESSED POST-OPC DATA", now U.S. Pat. No. 8,191,016, issued on May 29, 2012. The disclosure of this application is incorporated herein by reference in its entirety.

TECHNICAL FIELD

The present invention relates to integrated circuit manufacturing, and more particularly, some embodiments relate to systems and methods for compressed post-OPC data created during the design and manufacturing of integrated circuits.

DESCRIPTION OF THE RELATED ART

Integrated circuits, or ICs, are generally created by patterning several layers of devices and their interconnections onto a substrate, such as a semiconductor wafer. Generally, the circuit designer designs an integrated circuit using an electronic design automation (EDA) tool. The electronic design automation tool enables a circuit designer to input the positions and connections of various components of the circuit interactively. The electronic design automation process generates a circuit layout from circuit designer's inputs.

The circuit layout, or layout for short, contains the physical locations and dimensions of a circuit's components, interconnections, and various layers. These components, interconnections, and various layers form the features of an integrated circuit and take the form of polygons to represent a circuit layout. A layout file is generated that contains a dataset representing the plurality of polygons that make up the layout features on each layer. During manufacturing, these layers are patterned onto a substrate through a well-known process called photolithography. The photolithography process uses a series of photomasks created from the layout file to transfer the layout onto the substrate layer by layer.

Before the layout is finalized and the circuit manufactured, validation and enhancement processes may be performed. A process referred to as a Design Rule Check (DRC) is a part of the physical verification of the design that determines whether the layout design satisfies the recommended foundry process parameters called Design Rules. Once the electronic design automation tool translates the inputted target circuit design into a target circuit layout, the design rule checker validates the target circuit layout against one or more design rules. If the design rule check identifies a circuit feature that violates a design rule, the violation is flagged and brought to the designer's attention. The designer can then modify the design to remedy the violation.

Another process performed is referred to as Optical Proximity Correction, or OPC. Optical proximity correction (OPC) is a well-known example of a resolution enhancement technique, through which a circuit layout is modeled to predict image errors that might arise as a result of the photolithographic operation. The optical proximity correction then adjusts/corrects the circuit layout to account for any image errors it encounters. The adjusted/corrected circuit layout produced by OPC is often referred to as the post-OPC layout.

In some instances, a form of lithography verification is applied to assess the effectiveness of the compensations (corrections) made by the optical proximity correction to arrive at the adjusted/corrected target circuit layout. One example of lithography verification generates a contour from the post-OPC circuit layout and compares the contour against the original target layout. According to conventional practices, once a circuit design is created and verified within the design phase, the circuit design enters the manufacturing phase where it is sent to the foundry as a circuit layout. However, in the manufacturing phase, rather than transfer large amounts of post-OPC data, the foundry repeats OPC operations that were already performed during the design phase.

BRIEF SUMMARY OF EMBODIMENTS OF THE INVENTION

According to various embodiments of the invention, system and methods are provided for compressed post-OPC data created during the design and manufacturing of integrated circuits. For example, in one embodiment, post-OPC layout data is generated during the design phase and later utilized in the manufacturing phase to generate manufacturing layout data. More particularly, the biases between a target layout and post-OPC layout data are determined in the design phase, and this bias data (also known as post-OPC bias data) is provided to the manufacturing process. The manufacturing process, in turn, applies the post-OPC bias data to the original target layout data to regenerate the design phase post-OPC layout data during the manufacturing phase. Accordingly, a post-OPC layout data is available for use during the manufacturing phase without the need for running optical proximity correction during the manufacturing phase.

According to one embodiment of the invention, a computer-aided design apparatus that is configured to generate photolithographic data for patterning a circuit design onto a semiconductor wafer is provided. The computer-aided design apparatus comprises of a design tool and a manufacturing tool.

The design tool has a process, memory connected to the processor, and a computer readable medium having instructions for performing operations according to the invention. The design tool first receives target layout data for a given circuit design. Next, the design tool performs optical proximity correction on the target layout to generate post-OPC layout data. The differences between the post-OPC layout data and the target layout are then calculated and generated into post-OPC bias data.

The manufacturing tool also has a process, memory connected to the processor, and a computer readable medium having instructions for performing operations according to the invention. The manufacturing tool receives target layout data for a given circuit, accompanied by post-OPC bias data from the aforementioned design tool. Next, the manufacturing tool applies post-OPC bias data to the target layout data, thereby generating post-OPC layout data at the manufacturing tool. In some embodiments, the post-OPC layout data generated is similar or identical to the post-OPC layout data generated during the design phase.

In some such embodiments, the operation of calculating differences comprises determining a plurality of evaluation points for the target layout data. The plurality of evaluation points corresponds to evaluation points used to perform optical proximity correction on the target layout. Next, the manufacturing tool calculates a displacement between respective evaluation points for the target layout data and the evaluations points used to perform optical proximity correction.

In other such embodiments, the calculation of differences is performed as part of performing optical proximity correction on the target layout data.

In some embodiments, a method for generating compressed photolithographic data for patterning a circuit design onto a semiconductor wafer is provided. This method begins by performing optical proximity correction on the target layout data, thereby generating post-OPC layout data. Next, the method calculates differences between the post-OPC layout data and the target layout data in order to generate post-OPC bias data. The post-OPC bias data is eventually stored for use in recreating post-OPC layout data.

In some such embodiments, the method performs the calculation of differences and storing of the post-OPC bias data as part of performing optical proximity correction on the target layout data.

In further such embodiments, the method transfers the target layout data for the circuit design and the post-OPC bias data to a manufacturing tool. The manufacturing tool is configured to apply the post-OPC bias data to the target layout data, thereby regenerating the post-OPC layout data as a second post-OPC layout data.

In other such embodiments, the method receives at a post-tape-out manufacturing phase tool the target layout data for the circuit design and post-OPC bias data for post-tape-out optical proximity correction. Upon receiving both, the method applies the post-OPC bias data to the target layout data to regenerate the post-OPC layout as a second post-OPC layout data.

In some embodiments, the result of regenerating the post-OPC layout data during the post-tape-out manufacturing phase precludes the need to perform post-tape-out optical proximity correction in order to have a post-OPC layout available for use.

In other embodiments, the method receives at the post-tape-out manufacturing phase the target layout data and the post-OPC bias data for the circuit design. The post-OPC bias data comprises of data representing the differences between a post-OPC layout (represented by the post-OPC layout data generated during optical proximity correction) and a target layout (represented by the target layout data). Upon receiving the target layout data and the post-OPC bias data, the method applies the post-OPC bias data to the target layout data, thereby regenerating the post-OPC layout data as manufacturing layout data.

In further such embodiments, the method generates the post-OPC bias data by first determining a plurality of evaluation points for the target layout data. The plurality of evaluation points corresponds to evaluation points used to perform optical proximity correction on the target layout. Upon determination, the method calculates a displacement between respective the evaluation points for the target layout data and the evaluation points used to perform optical proximity correction.

In other embodiments, another computer-aided design apparatus comprising a processor, memory connected to the processor, and a computer readable medium having instructions therein, is provided. The instruction are configured to cause the processor to perform operations according to the invention. This computer-aided design apparatus first performs optical proximity correction on the target layout data to generate post-OPC layout data. The computer-aided design apparatus calculates the differences between the post-OPC layout data and the target layout data to generate post-OPC bias data. Eventually, the computer-aided design apparatus stores post-OPC bias data for use in recreating post-OPC layout data. In some such embodiments, the computer-aided design apparatus transfers the target layout data and the post-OPC bias data to a manufacturing tool. The manufacturing tool is configured to apply the post-OPC bias data to the target layout data to regenerate post-OPC layout data as a second post-OPC layout data.

In other such embodiments, a second computer readable medium has instructions configured to instruct the processor to receive, at a post-tape-out manufacturing phase tool, the target layout data for the circuit design and the post-OPC bias data for post-tape-out optical proximity correction. Next, the processor is instructed to apply the post-OPC bias data to the target layout data, thereby regenerating post-OPC layout data during post-tape-out optical proximity correction.

In another embodiment, yet another computer-aided design apparatus comprising a processor, memory connected to the processor, and a computer readable medium having instructions therein is provided. The instruction are configured to cause the processor to receive at a post-tape-out manufacturing phase target layout data and post-OPC bias data for the circuit design. The post-OPC bias data comprises data representing differences between a post-OPC layout (represented by the post-OPC layout data generating during optical proximity correction) and the target layout (represented by the target layout data). Once the target layout data and the post-OPC bias data is received, the processor of the computer-aided design apparatus is instructed to apply the post-OPC bias data to the target layout data, thereby regenerating post-OPC layout data as manufacturing layout data.

In other such embodiments, the instructions are further configured to cause the processor to determine the plurality of evaluation points for the target layout data. The plurality of evaluation points corresponds to evaluation points used to perform optical proximity correction on the target layout. Next, the processor is instructed to calculate a displacement between respective the evaluation points for the target layout data and the evaluation points used to perform optical proximity correction.

In some embodiments, a computer program product that performs operations in accordance with the invention is provided.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following Figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale. The Figures are not intended to be exhaustive or to limit the invention to the precise form disclosed.

DETAILED DESCRIPTION OF THE EMBODIMENTS OF THE INVENTION

The present invention is directed in various embodiments toward integrated circuit manufacturing. More particularly, some embodiments relate to systems and methods for compressing and utilizing post-OPC data created during the design manufacturing of integrated circuits. For example, in one embodiment, post-OPC layout data generated during the design phase is compressed and later utilized in the manufacturing phase to generate manufacturing layout data. More particularly, in one embodiment biases between a target layout and post-OPC layout data are determined in the design phase, and this bias data (also known as post-OPC bias data) is provided to the manufacturing phase. The manufacturing phase, in turn, applies the post-OPC bias data to the original target layout data to regenerate the design phase post-OPC layout data during the manufacturing phase. Accordingly, the systems and methods can be implemented such that post-OPC layout data is available for use during the manufacturing phase without the need for running optical proximity correction during the manufacturing phase.

As previously noted, within circuit manufacturing according to conventional practices, the post-tape-out phase receives the circuit design as a target layout dataset describing a plurality of polygons that define the layout. This requires that post-tape-out optical proximity correction be performed on the target layout. Despite the fact that design phase optical proximity correction is performed, the optical proximity layout data generated during the design phase is not sent in place of the circuit layout. One reason for this is because it is prohibitive to transfer the large volume of data produced during design phase optical proximity correction. In general, the post-OPC layout data for a given circuit design is vastly larger than the volume of data used to represent the target layout. This is due to the quantity and complexity of shapes in the post-OPC layout data needed to compensate for the photolithographic phenomena.

Accordingly, in one embodiment of the invention, a compression technique is provided, allowing the transfer and use of design phase optical proximity correction data during the post-tape-out phase of circuit manufacturing. In such embodiments, during the design phase, post-OPC biases are generated and saved. Subsequently, the post-OPC bias data (rather than the post-OPC layout data) is sent to the foundry for the post-tape-out phase. Upon receipt of the post-OPC bias data, the foundry can apply the post-OPC bias data to the original circuit layout (also referred to as the target layout), thereby regenerating the post-OPC layout within the post-tape-out phase. Regenerating in this manner can be implemented to result in a post-OPC layout that is identical to, or at least similar to the post-OPC layout generated in the design phase.

In some embodiments, the post-OPC biases reflect the differences between the original circuit layout and the post-OPC layout. Once the post-OPC bias data is applied to the original circuit layout, the foundry can utilize the regenerated post-OPC layout as if it were the product of post-tape-out optical proximity correction. In some embodiments, the post-OPC biases are determined based on a set of evaluation points. For example, points on the contour can be identified as corresponding to the evaluation points used at the target layout. In this example, the post-OPC bias data can represent differences between the target layout and the post-OPC layout at the evaluation points. Accordingly, when the post-OPC bias data is applied to the original target circuit layout at the post-tape-out phase, the displacements contained within the post-OPC bias data will allow for the creation of the post-OPC layout from the original circuit layout, without the need to rerun optical proximity correction.

Figure 1:
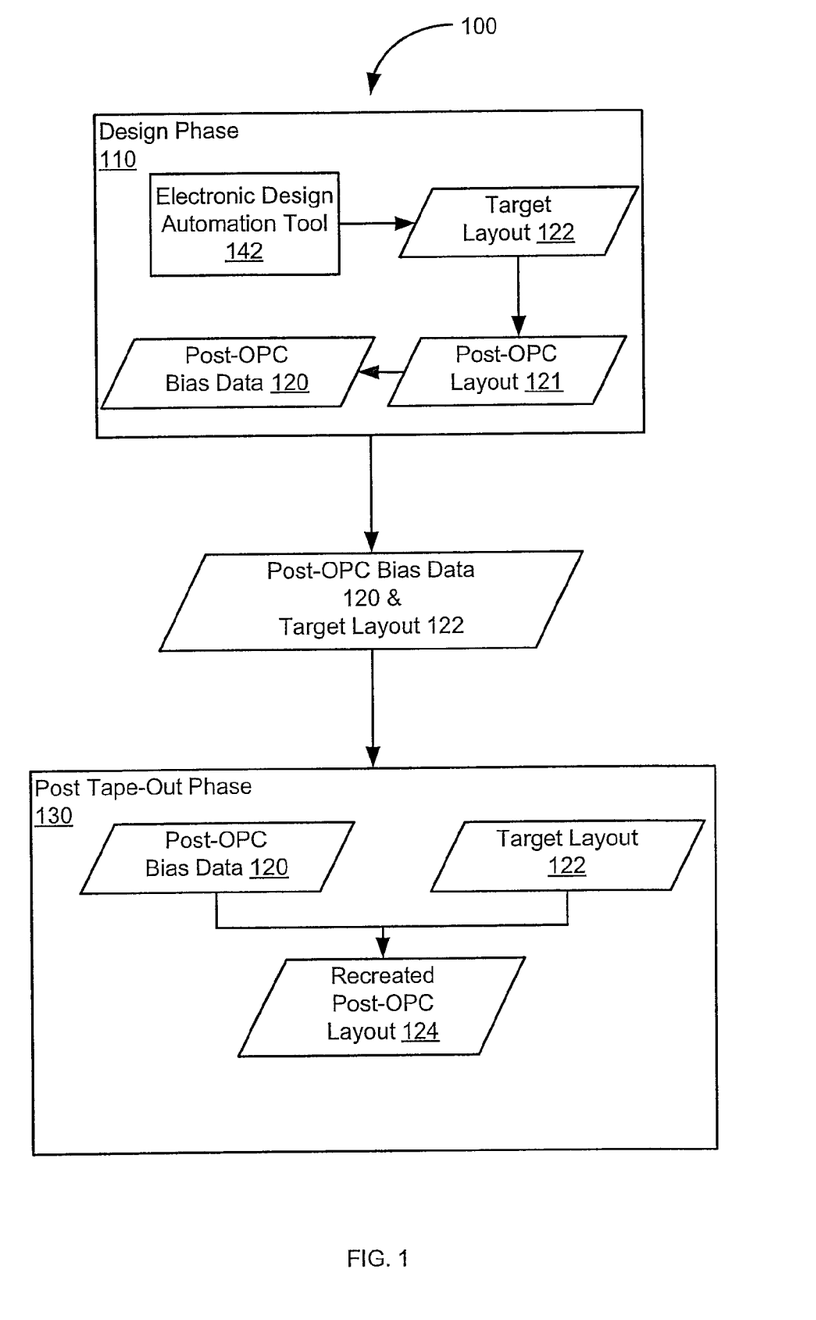
FIG. 1 is a diagram illustrating a high-level example process in accordance with one embodiment of the invention.

FIG. 1 is a process diagram 100 illustrating a high-level example process in accordance with one embodiment of the invention. Referring now to FIG. 1, within the design phase 110, a target layout is generated. The target layout 122 is typically a data set comprising a plurality of polygons that together represent the desired layout patterns for the layers of the semiconductor device to be fabricated. As noted, the target layout 122 can be generated, for example, from the circuit design using an Electronic Design Automation (EDA) tool 142. Examples of polygons 176, 177 for a portion 170 of a target layout 122 are described in further detail below with reference to FIG. 2.

Figure 2:
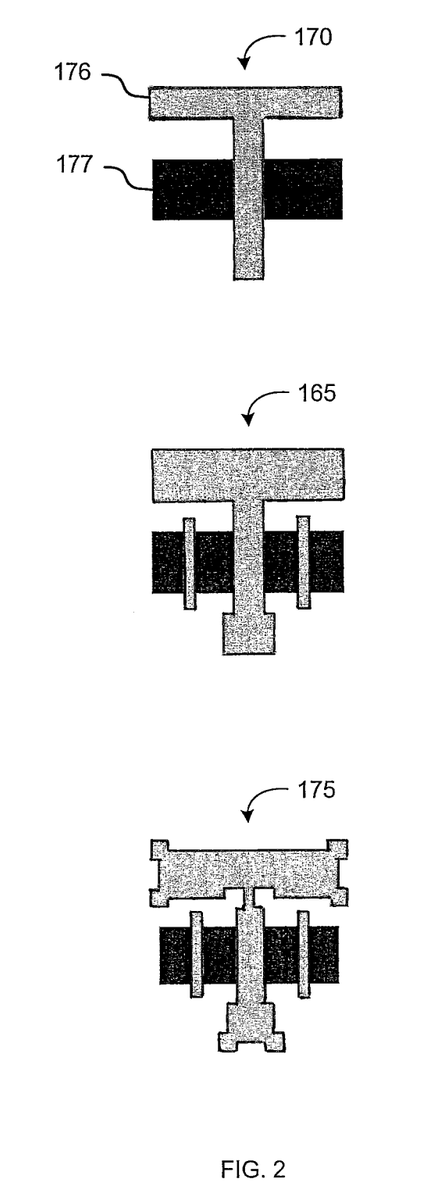
FIG. 2 is a diagram illustrating example portions of a target layout, a target layout after retargeting and resizing, and a post-OPC layout.

Within design phase 110, a post-OPC layout 121 is generated by a design phase optical proximity correction process. The resultant post-OPC layout 121 is a dataset representing the plurality of polygons that make up the layout as modified by the OPC process—in other words, as modified to compensate for the effects anticipated by the photolithography operations that will be used to pattern the layers. An example of the post-OPC layout 121 is shown by the layout portion illustrated at 175 in FIG. 2. As the example in FIG. 2 illustrates, the post-OPC layout portion 175 is a more complex set of polygons than is the corresponding original target layout portion 170.

Accordingly, in one embodiment, post-OPC layout 121 can be further reduced or compressed. For example, in one embodiment, post-OPC layout 121 is compared with the original target layout 122 to generate post-OPC bias data 120. As noted above, post-OPC bias data represents differences between the target layout 122 and post-OPC layout 121.

As illustrated in FIG. 1, the post-OPC bias data 120 and target layout data 122 are transferred to the post-tape-out, or manufacturing, phase 130. Accordingly, instead of sending the entire post-OPC layout 121 to the post-tape-out phase 130, the post-OPC layout 121 is reduced to post-OPC biases 120, and just this bias data is sent with the target layout 122.

At the post-tape-out phase 130, the target layout 122 and the post-OPC bias data 120 are utilized to generate a post-OPC layout 124. Particularly, in one embodiment, the post-OPC bias data 120 is applied to the target layout 122 to create post-OPC layout 124. According to some embodiments of the invention, the post-OPC layout 124 is similar or identical to post-OPC layout 121 as determined in the design phase 110.

FIG. 2 is a diagram illustrating example portions of a target layout, a target layout after retargeting and resizing, and a post-OPC layout. Referring now to FIG. 2, the example original target layout portion 170 is comprised of a plurality of polygons representing a portion of the pattern targeted for transfer to one of the semiconductor layers. As seen from this illustration, this original target layout portion 170 can be described by a plurality of rectangles to represent the "T" shaped pattern 176 overlaying the rectangular pattern 177.

The layout portion 165 represents an example of layout portion 170 after retargeting and resizing and after the addition of assist-features that can be added, for example, by a re-targeting and assist feature generator. Assist features can be implemented with off axis illumination conditions to improve depth of focus and uniformity of critical dimensions. Sub-resolution assist features can be used to modify the environment of features such that they appear denser than they would otherwise appear without such assist features.

Layout portion 175 is an example of a portion of the layout (layout portion 170) after OPC processing has been applied. As illustrated by the example at 175, the patterns have been modified to take into account process conditions such that the application of the photolithographic process during manufacturing will more likely result in a better approximation of the original target layout.

Figure 3:
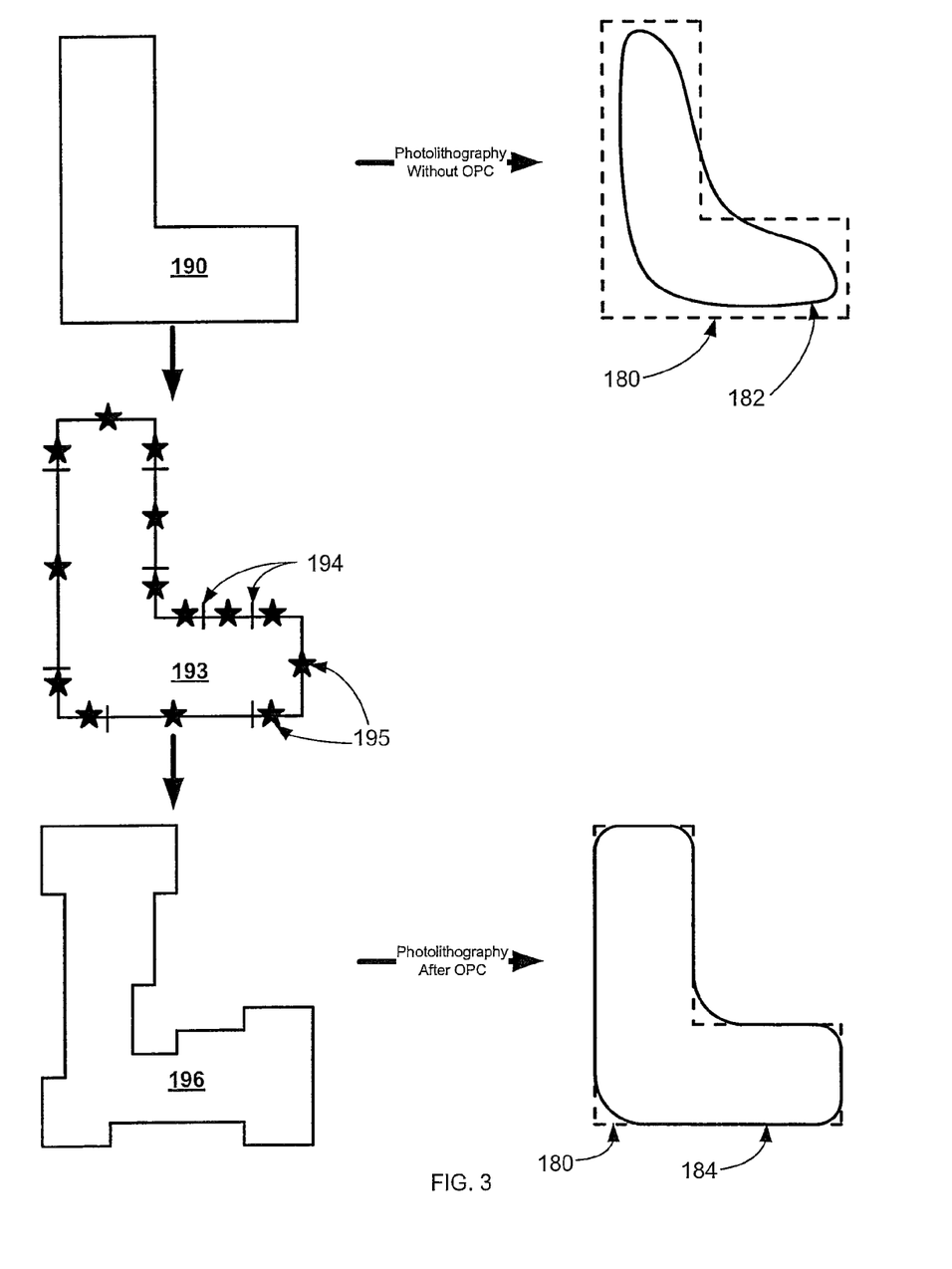
FIG. 3 is a diagram illustrating examples of an application of optical proximity correction to an original target layout resulting in a post-OPC layout and post-OPC contours.

FIG. 3 is a diagram illustrating examples of an application of optical proximity correction to an original target layout to result in a post-OPC layout and post-OPC contours. Referring now to FIG. 3, this example is described with reference to a simple target layout data portion. This example is the L-shaped portion 190 illustrated in FIG. 3. Due to real-world process conditions, if the photolithographic operations are applied to the target layout portion 190 without optical proximity correction, the result would not replicate the original target shape. In the illustrated example, the resultant shape is illustrated as example contour 182. FIG. 3 overlays this contour 182 with the ideal target illustrated by dashed lines 180. As can be seen by this overlay, the resultant contour 182 is different from the target layout portion 190. Accordingly, optical proximity correction can be applied to modify the actual layout such that the patterned contour more closely aligns with the original target layout.

With continued reference to FIG. 3, one methodology for optical proximity correction is illustrated with reference to layout portion 193. In this example, dissection points 194 and evaluation points 195 are defined with respect to the original L-shaped pattern, and are utilized in performing optical proximity correction. In this example, the edges of layout portion 190 are divided into segments using dissection points 194. The, one or more evaluation points 195 placed on each segment. Segments and evaluation points 194 can be chosen based on known or anticipated photolithographic effects. The OPC process determines how much inward or outward bias should be applied to the segments of the layout element at each evaluation point 195 to account for photolithographic conditions. In one embodiment according to the invention, the post-OPC bias data described herein includes data representing these inward or outward biases produced during the OPC process.

Continuing with this example, application of the optical proximity correction process results in layout portion 196 as illustrated in FIG. 3. As seen by this example, layout portion 196 is different from the original target layout portion 190 from which it is derived. These differences are intended to compensate for the photolithographic process to result in patterning of the feature in a manner that more closely resembles the original target layout. An example of this is illustrated in FIG. 3 wherein contour 184 represents a contour generated by the application of the photolithographic process to the post-OPC layout portion 196. As illustrated in this example, post-OPC contour 184 is more closely aligned with original layout portion 190 then was the contour 182 arrived at prior to optical proximity correction.

In one embodiment of the invention, biases or differences between original layout portion 190 and post-OPC layout 196 can be determined. Preferably, these biases result in a data set that is smaller than the data set that would otherwise be used to represent post-OPC layout 194 accurately. For example, the data set can be defined as differences between original layout 190 and post-OPC layout 196 at the evaluation points. Accordingly, given the original layout data and the generated bias data, post-OPC layouts are generated without rerunning the OPC. This post-OPC bias data is provided to the post-tape-out (manufacturing) phase such that the post-tape-out phase can re-create an approximate post-OPC layout data 196 as previously determined in the design phase without the interim operation of performing OPC on original layout portion 190.

Figure 4:
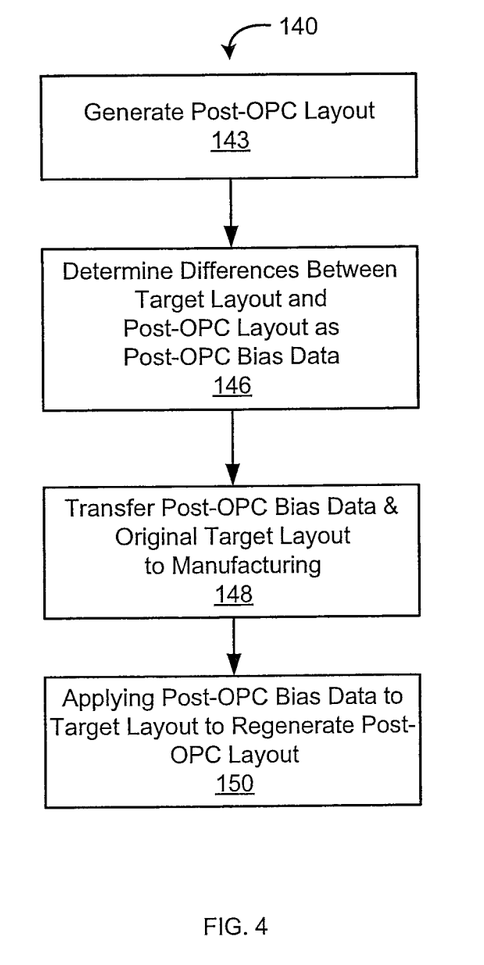
FIG. 4 is a diagram illustrating an example process for generating and utilizing the design-phase post-OPC layout in accordance with one embodiment of the invention.

FIG. 4 is a diagram illustrating an example process 140 for generating and utilizing the design-phase post-OPC bias data in accordance with one embodiment of the invention. Referring now to FIG. 4, at operation 143, a post-OPC layout 121 is generated from a given target layout 122. As noted above, in one embodiment, optical proximity correction can result in the generation of post-OPC layout data. As also described above, the optical proximity correction operation can be performed utilizing dissection points and evaluation points.

Upon generation, the differences between target layout and the post-OPC layout can be determined at operation 146. As previously noted, in one embodiment, these differences can be determined with respect to dissection points and evaluation points, thus defining a scope for the data set. As an example, with reference to the example layout portions described in FIG. 3, bias data can represent differences between evaluation points 195 on the target layout 190 and corresponding points on the post-OPC layout 196 within segments defined by dissection points 194. In such examples, the differences are represented as post-OPC bias data 120. The post-OPC bias data 120 indicates a magnitude and direction of change for the feature edge at each dissection point.

At operation 148, the post-OPC bias data 120 and the original target layout 122 are transferred to the post-tape-out phase 130 for manufacturing. As previously described, because in some embodiments, the post-OPC bias data 120 is significantly smaller than the data set representing post-OPC layout 121, the bias data transfer can be more efficient.

At operation 150, the transferred post-OPC bias data 120 is applied to the original layout data 122 to generate in the post-tape-out phase the post-OPC layout 124 similar to that as determined in the design phase. Having regenerated this post-OPC layout data 124 within the post-tape-out phase, post-tape-out phase optical proximity correction is avoided at the manufacturing phase.

Figure 5:
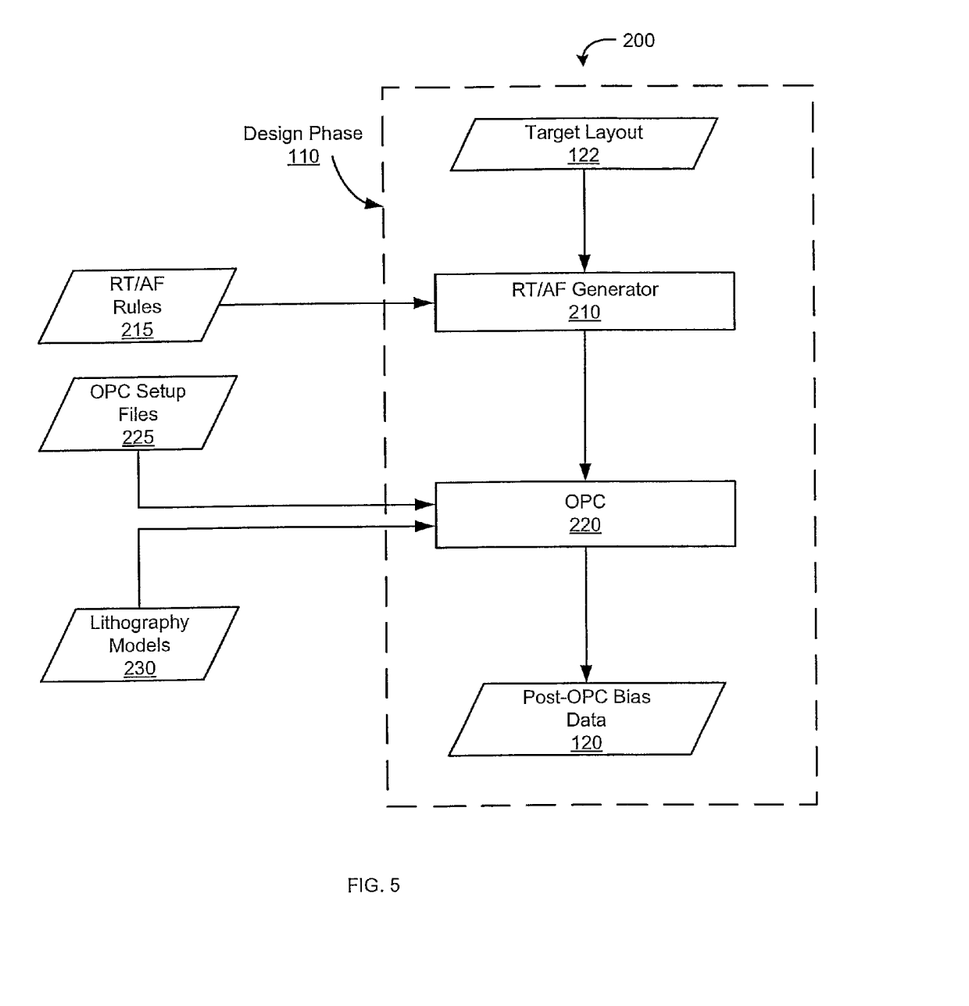
FIG. 5 is a flowchart illustrating the design phase of an example circuit manufacturing implementation in accordance with the invention.

FIG. 5 is a flowchart 200 illustrating an example implementation of the design phase 110 for circuit manufacturing in accordance with one embodiment of the invention. Referring now to FIG. 5, in the design phase 110, target layout data 122 is generated based on the circuit design data. As described above, target layout data 122 represents, at least, an ideal layout independent of real-world process conditions.

Within the design phase 110, the target layout data 122 is processed through a re-targeting and assist feature generator 210. For example, this can be accomplished through re-targeting and assist feature rules 215, both of which are commonly known in the art. The output from the re-targeting and assist feature generator 210 is processed by an optical proximity correction (OPC) process 220. Typically, the OPC process 220 uses OPC setup files 225 and lithography models 230 to generate post-OPC layout data. An example of a portion of a layout feature after retargeting and assist and optical proximity correction are applied, is illustrated in FIG. 2 at 175. In some embodiments, the OPC process 220 generates a post-OPC bias data 120 in accordance with the invention. As previously noted with respect FIG. 4, within some embodiments, the post-OPC bias data embodies the differences between respective evaluation points on a target layout and on a post-OPC layout.

Figure 6:
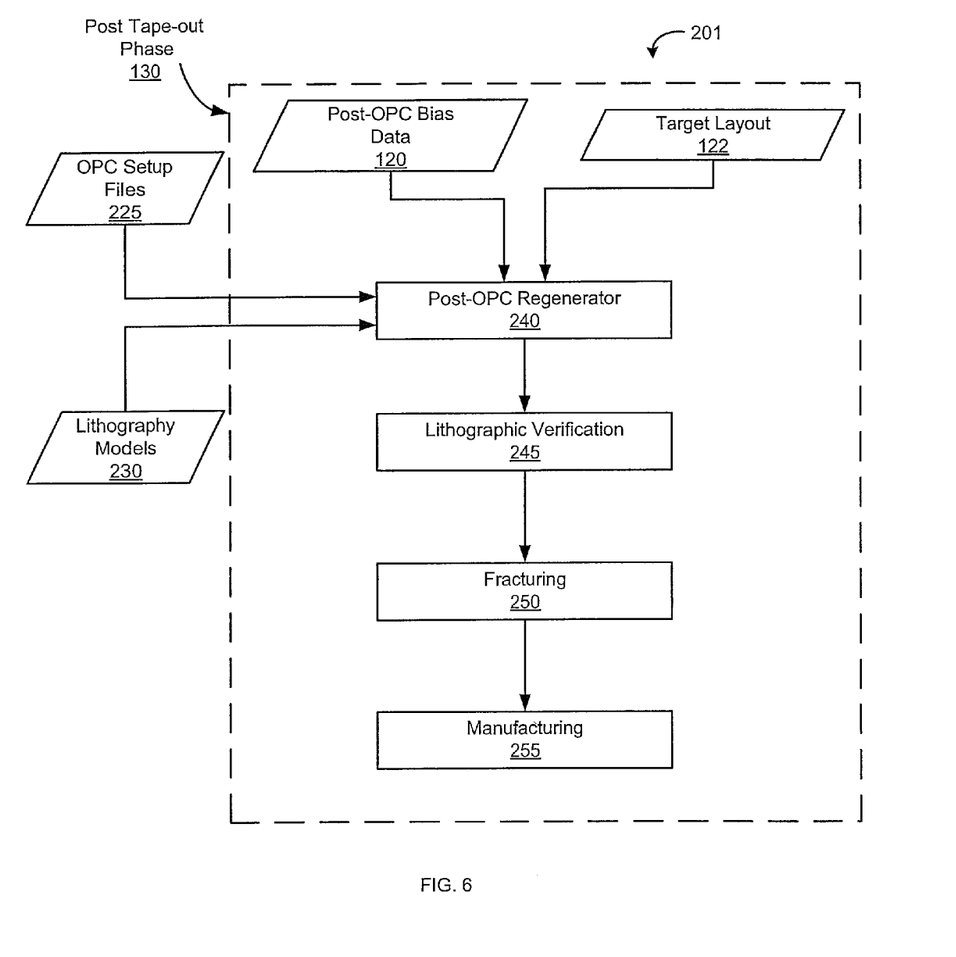
FIG. 6 is a flowchart illustrating the post-tape-out phase of an example circuit manufacturing implementation in accordance with the invention.

FIG. 6 is a flowchart 201 illustrating an example implementation of the post-tape-out phase 130, or manufacturing phase, in accordance with one embodiment of the invention. The phase can start after a post-OPC bias data 120 and target layout 122 are transferred from the design phase (110) to the post-tape-out phase.

At operation 240, a post-OPC regenerator generates a post-OPC layout based on post-OPC bias data 120 and target layout 122. In some embodiments according to the invention, the post-OPC regenerator uses OPC setup files and lithography models to generate post-OPC layout data. In yet further embodiments, OPC setup files and lithography models are lithography models are those used in the design phase 110. As previously noted, in some embodiments, the transferred post-OPC bias data 120 is applied to the original target layout 122 to generate in the post-tape-out phase the post-OPC layout data as determined in the design phase. Having regenerated this post-OPC layout data within the post-tape-out phase, post-tape-out phase optical proximity correction can be avoided at the manufacturing phase.

At operation 245, in some embodiments, lithographic verification is performed upon the regenerated post-OPC layout data 124. Lithographic verification is a well-known process by which the adjustments made to a target circuit layout 122 by resolution enhancement technique (RET)—such as optical proximity correction—can be verified for desired effect. In further embodiments, at operation 250, another well known process, fracturing, is performed. With fracturing, the mask to a circuit feature is adjusted such that with each lithographic exposure, a rectangle or trapezoid is formed. This example implementation concludes at operation 255 by performing the manufacturing process of the circuit.

Figure 7:
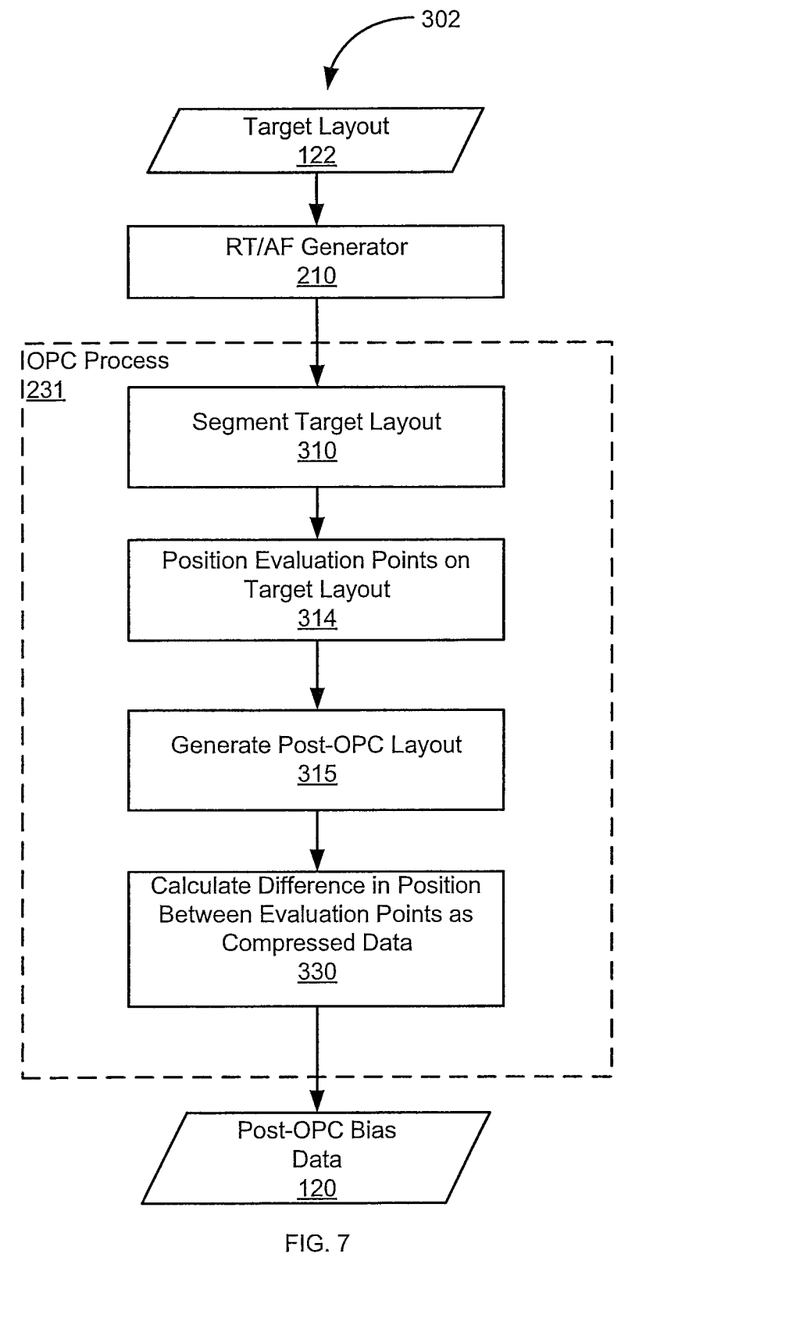
FIG. 7 is a flowchart illustrating an example method for generating post-OPC compressed data in accordance with one embodiment of the invention.

FIG. 7 is a flowchart illustrating an example method 302 for generating post-OPC compressed data in accordance with one embodiment of the invention. In some embodiments according to the invention, generation of post-OPC bias data 120 is generated as part of the OPC process. Referring now to FIG. 7, in the illustrated example, the generation of post-OPC bias data commences at operation 210, where target circuit layout data set 122 is re-targeted and assist features are added by a RT/AF generator. The target circuit layout 122 is then transferred to an optical proximity correction (OPC) process 231.

Within OPC process 231, operation 310 divides portions of the target layout into a plurality of segments. As previously noted, within some embodiments, dissection points 194 are utilized to define the segments into which the layout portions are divided. The dissection points and segment definitions are chosen based on knowledge of typical or anticipated effects of the photolithographic process. For example, in one embodiment, dissection points can be placed within a predetermined distance of corners of the layout portion. As a further example, consider layout portion 193 illustrated in FIG. 3 where dissection points 194 are positioned along the line segments at each edge of portion 193 and proximate to the corners of the feature.

At operation 314, evaluation points 195 are positioned in the target layout. Evaluation points 194 can also be positioned based on knowledge of the optical proximity correction process. For example, one embodiment places evaluation points near corners in the identified segments as well as near the center of longer line segments. Again, layout portion 193 illustrated in FIG. 3 provides a further example where evaluation points 195 are placed proximate corners of layout portion 193 and in the center of straight line segments between two dissection points 194.

At operation 315, a post-OPC layout is generated according to well known methods for optical proximity correction. As previously noted, within some embodiments, the dissection points 194 and evaluation points 195 as illustrated in layout 194 of FIG. 3 are used to perform optical proximity correction.

At operation 330, differences between the post-OPC layout data set, as generated at operation 315, and the target layout data set are calculated. Particularly, differences in position between respective evaluation points for the post-OPC layout data set and target layout data set are determined. From this, post-OPC biases data 120 can be generated.

Figure 8:
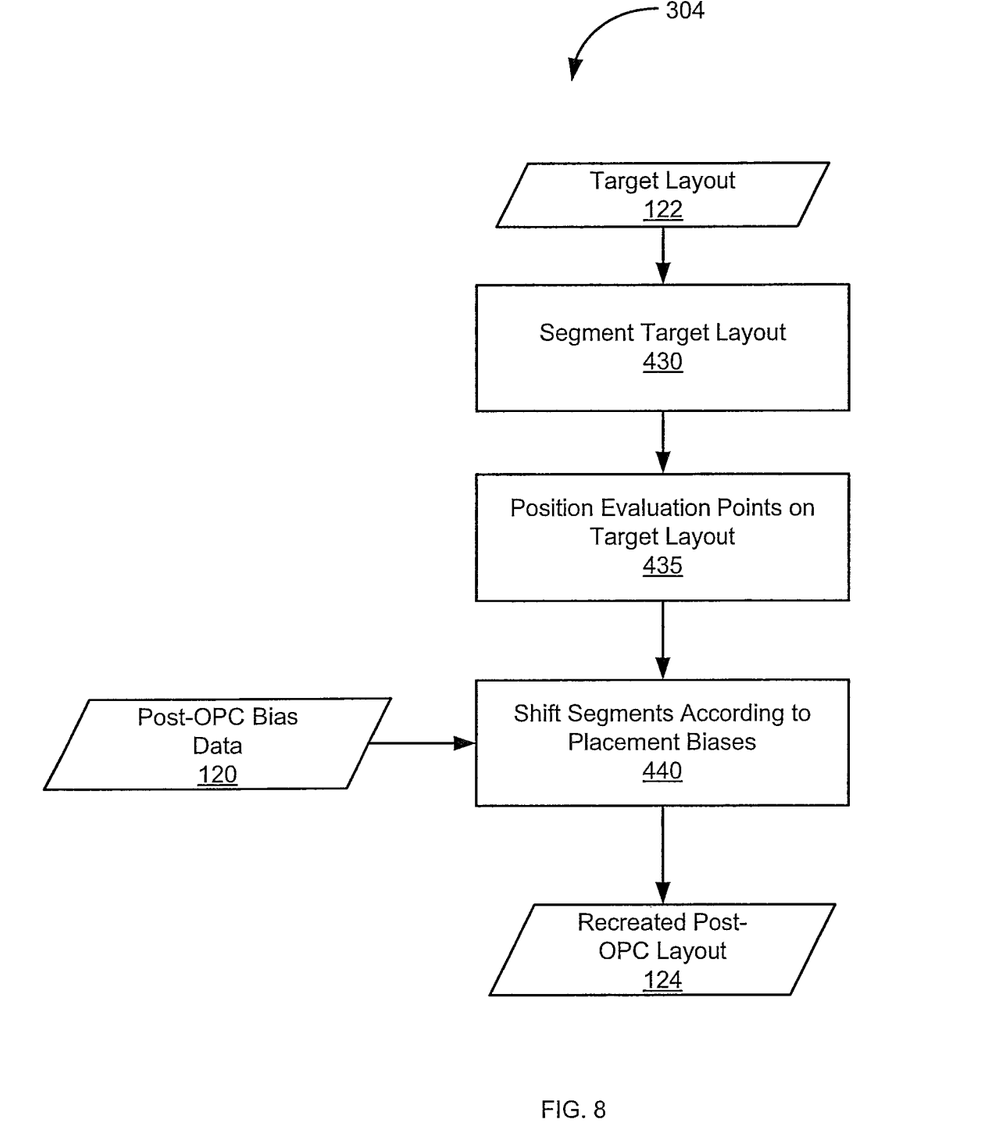
FIG. 8 is a flowchart illustrating an example method for regenerating the post-OPC layout in according with one embodiment of the invention.

FIG. 8 is a flowchart illustrating an example process 304 for generating the post-OPC layout in the post-tape-out manufacturing phase. As noted above, this provides for a post-OPC layout data 124 at post-tape-out phase 130 without the need for rerunning optical proximity correction during the post-tape-out phase. Rather, the post-OPC layout 124 is generated by applying the bias data 120 to the target layout data 122.

Referring now to FIG. 8, target circuit layout data set 122 is received by operation 240. Operations 430 and 435 can be performed similar to operations 310 and 314 of FIG. 6. At operation 430, portions of the target layout are divided into a plurality of segments. For example, in one embodiment, that dissection points 194 can be utilized to define the segments into which the layout portions are divided. At operation 435, evaluation points 195 are positioned in the target layout. Evaluation points can also be positioned based on knowledge of the optical proximity correction process. In another embodiment, dissection points 194 and evaluation points 195 can be chosen based on location information in bias data set 120.

At operation 440, method 304 receives post-OPC bias data 120 and applies the biases to shift segments of target layout according to the bias values. For example, the biases can specify a magnitude and direction of shift for a segment of an evaluation point 195. The resulting layout is preferably similar to, if not identical to, the post-OPC layout originally generated during design phase optical proximity correction. Then, this recreated post-OPC layout 124 is employed within the manufacturing phase processes.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 9:
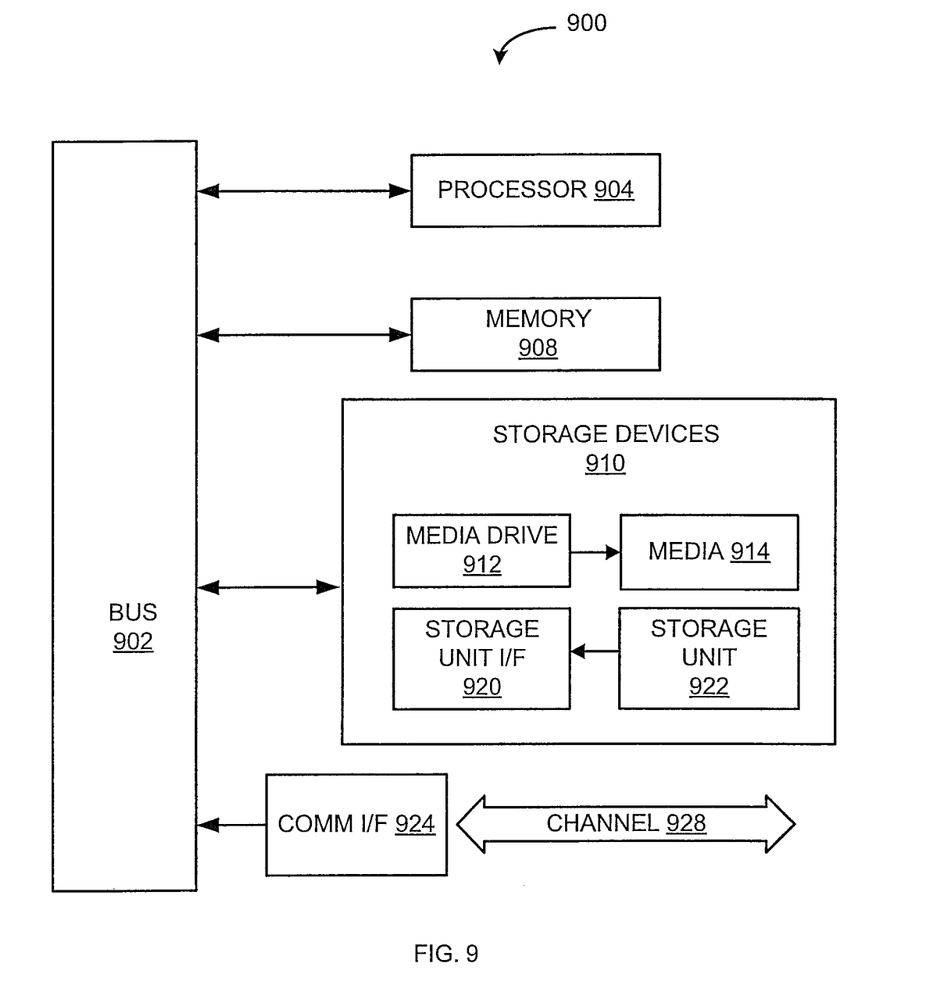
FIG. 9 is a diagram illustrating a computer system that can be used in conjunction with the systems and methods described herein.

Referring now to FIG. 9, computing module 900 may represent, for example, computing or processing capabilities found within desktop, laptop and notebook computers; mainframes, supercomputers, workstations or servers; or any other type of special-purpose or general-purpose computing devices as may be desirable or appropriate for a given application or environment. Computing module 900 might also represent computing capabilities embedded within or otherwise available to a given device. For example, a computing module might be found in other electronic devices. Computing module 900 might include, for example, one or more processors or processing devices, such as a processor 904. Processor 904 might be implemented using a general-purpose or special-purpose processing engine such as, for example, a microprocessor, controller, or other control logic.

Computing module 900 might also include one or more memory modules, referred to as main memory 908. For example, random access memory (RAM) or other dynamic memory might be used for storing information and instructions to be executed by processor 904. Main memory 908 might also be used for storing temporary variables or other intermediate information during execution of instructions by processor 904. Computing module 900 might likewise include a read only memory ("ROM") or other static storage device coupled to bus 902 for storing static information and instructions for processor 904.

The computing module 900 might also include one or more various forms of information storage mechanism 910, which might include, for example, a media drive 912 and a storage unit interface 920. The media drive 912 might include a drive or other mechanism to support fixed or removable storage media 914. For example, a hard disk drive, a floppy disk drive, a magnetic tape drive, an optical disk drive, a CD or DVD drive (R or RW), or other removable or fixed media drive. Accordingly, storage media 914 might include, for example, a hard disk, a floppy disk, magnetic tape, cartridge, optical disk, a CD or DVD, or other fixed or removable medium that is read by, written to or accessed by media drive 912. As these examples illustrate, the storage media 914 can include a computer usable storage medium having stored therein particular computer software or data.

In alternative embodiments, information storage mechanism 910 might include other similar instrumentalities for allowing computer programs or other instructions or data to be loaded into computing module 900. Such instrumentalities might include, for example, a fixed or removable storage unit 922 and an interface 920. Examples of such storage units 922 and interfaces 920 can include a program cartridge and cartridge interface, a removable memory (for example, a flash memory or other removable memory module) and memory slot, a PCMCIA slot and card, and other fixed or removable storage units 922 and interfaces 920 that allow software and data to be transferred from the storage unit 922 to computing module 900.

Computing module 900 might also include a communications interface 924. Communications interface 924 might be used to allow software and data to be transferred between computing module 900 and external devices. Examples of communications interface 924 might include a modem or softmodem, a network interface (such as an Ethernet, network interface card, WiMAX, 802.XX or other interface), a communications port (such as for example, a USB port, IR port, RS232 port, Bluetooth interface, or other port), or other communications interface. Software and data transferred via communications interface 924 might typically be carried on signals, which can be electronic, electromagnetic, optical or other signals capable of being exchanged by a given communications interface 924. These signals might be provided to communications interface 924 via a channel 928. This channel 928 might carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 908, storage unit 920, media 914, and signals on channel 928. These and other various forms of computer program media or computer usable media may be involved in carrying one or more sequences of one or more instructions to a processing device for execution. When executed, such instructions might enable the computing module 900 to perform features or functions of the present invention as discussed herein.

While various embodiments of the present invention have been described above, it should be understood that they have been presented by way of example only, and not of limitation. The breadth and scope of the present invention should not be limited by any of the above-described exemplary embodiments. Where this document refers to technologies that would be apparent or known to one of ordinary skill in the art, such technologies encompass those apparent or known to the skilled artisan now or at any time in the future. In addition, the invention is not restricted to the illustrated example architectures or configurations, but the desired features can be implemented using a variety of alternative architectures and configurations. As will become apparent to one of ordinary skill in the art after reading this document, the illustrated embodiments and their various alternatives can be implemented without confinement to the illustrated example. One of ordinary skill in the art would also understand how alternative functional, logical or physical partitioning and configurations could be utilized to implement the desired features of the present invention.

Furthermore, although items, elements or components of the invention may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What is claimed is:

1. A method of generating post-tape-out photolithographic data for patterning a circuit design onto a semiconductor wafer, comprising the operations of:
    receiving at a post-tape-out manufacturing phase tool, target layout data and post-OPC bias data for the circuit design, wherein the post-OPC bias data comprises data representing differences between a post-OPC layout represented by post-OPC layout data generated during optical proximity correction and a target layout represented by the target layout data; and
    using a computer system to apply the post-OPC bias data to the target layout data to regenerate the post-OPC layout data as manufacturing layout data.

2. The method of claim 1, further comprising the operation of generating the post-OPC bias data, and wherein the operation of generating the post-OPC bias data comprises:
    determining a plurality of evaluation points for the target layout data, wherein the plurality of evaluation points corresponds to evaluation points used to perform optical proximity correction on the target layout; and calculating a displacement between respective ones of the evaluation points for the target layout data and the evaluation points used to perform optical proximity correction.

3. The method of claim 1, wherein as a result of regenerating the post-OPC layout data, the post-OPC layout is available for use by the post-tape-out manufacturing phase tool without performing post-tape out optical proximity correction.

4. A computer-aided design apparatus configured to generate photolithographic data for patterning a circuit design onto a semiconductor wafer, comprising:
   a processor;
   a memory connected to the processor; and
   a non-transitory computer readable medium having instructions embedded therein, the instructions configured to cause the processor to perform the operations of:
      receiving at a post-tape-out manufacturing phase tool, target layout data and post-OPC bias data for the circuit design, wherein post-OPC bias data comprises data representing differences between a post-OPC layout represented by post-OPC layout data generated during optical proximity correction and a target layout represented by the target layout data;
      applying the post-OPC bias data to the target layout data to regenerate post-OPC layout data as manufacturing layout data.

5. The computer-aided design apparatus of claim 4, wherein the instructions are further configured to cause the processor to perform the operation of generating the post-OPC bias data, and wherein generating the post-OPC bias data comprises:
   determining a plurality of evaluation points for the target layout data, wherein the plurality of evaluation points corresponds to evaluation points used to perform optical proximity correction on the target layout; and
   calculating a displacement between respective ones of the evaluation points for the target layout data and the evaluation points used to perform optical proximity correction.

6. The computer-aided design apparatus of claim 4, wherein as a result of regenerating the post-OPC layout data, the post-OPC layout is available for use by the post-tape-out manufacturing phase tool without performing post-tape out optical proximity correction.

7. A computer program product having instructions embedded in a non-transitory computer useable medium, the instructions configured to cause a processor to perform a method of generating post-tape-out photolithographic data for patterning a circuit design onto a semiconductor wafer, comprising the operations of:
   receiving at a post-tape-out manufacturing phase tool, target layout data and post-OPC bias data for the circuit design, wherein post-OPC bias data comprises data representing differences between a post-OPC layout represented by post-OPC layout data generated during optical proximity correction and a target layout represented by the target layout data; and
   applying the post-OPC bias data to the target layout data to regenerate post-OPC layout data as manufacturing layout data.

8. The computer program product of claim 7, wherein as a result of regenerating the post-OPC layout data, the post-OPC layout is available for use by the post-tape-out manufacturing phase tool without performing post-tape out optical proximity correction.

9. The computer program product of claim 7, wherein the instructions are further configured to cause a processor to perform the operation of generating the post-OPC bias data, and wherein the operation of generating the post-OPC bias data comprises:
   determining a plurality of evaluation points for the target layout data, wherein the plurality of evaluation points corresponds to evaluation points used to perform optical proximity correction on the target layout; and
   calculating a displacement between respective ones of the evaluation points for the target layout data and the evaluation points used to perform optical proximity correction.

* * * * *